United States Patent
Kao

(10) Patent No.: US 7,570,495 B2
(45) Date of Patent: Aug. 4, 2009

(54) ELECTROMAGNETIC SHIELDING DEVICE

(75) Inventor: Min-Che Kao, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 1 day.

(21) Appl. No.: 11/743,160

(22) Filed: May 2, 2007

(65) Prior Publication Data

US 2007/0268679 A1    Nov. 22, 2007

(30) Foreign Application Priority Data

May 19, 2006    (TW) ............................ 95117814 A

(51) Int. Cl.
*H05K 9/00*    (2006.01)
(52) U.S. Cl. .................. 361/816; 174/350; 174/351; 174/362; 174/367; 174/368
(58) Field of Classification Search ................. 361/816; 174/350, 351, 362, 367, 368
See application file for complete search history.

(56) References Cited

U.S. PATENT DOCUMENTS

| 3,830,954 | A | * | 8/1974 | Caudill ...................... 174/362 |
| 4,110,552 | A | * | 8/1978 | Lombardi ................... 174/367 |
| 4,368,369 | A | * | 1/1983 | Matsumoto et al. ......... 200/511 |
| 5,086,509 | A | * | 2/1992 | Inubushi et al. ........... 455/575.8 |
| 5,722,133 | A | * | 3/1998 | Farris et al. .................... 27/17 |
| 5,847,938 | A | * | 12/1998 | Gammon ..................... 361/816 |
| 6,304,724 | B1 | * | 10/2001 | Ando .......................... 396/29 |
| 6,644,489 | B2 | * | 11/2003 | Chang ................... 220/203.01 |
| 6,979,773 | B2 | * | 12/2005 | Fursich ....................... 174/377 |
| 7,114,856 | B2 | * | 10/2006 | Ohbayashi et al. ............ 385/88 |
| 2002/0061102 | A1 | * | 5/2002 | Miyazaki et al. ............. 379/330 |
| 2008/0062668 | A1 | * | 3/2008 | Kakinoki et al. ............. 361/816 |

FOREIGN PATENT DOCUMENTS

CN    2511101    9/2002

OTHER PUBLICATIONS

"1st Office Action of China counterpart application", issued on Apr. 3, 2009, p. 1-p. 5.

* cited by examiner

*Primary Examiner*—Dean A. Reichard
*Assistant Examiner*—Xiaoliang Chen
(74) *Attorney, Agent, or Firm*—Jianq Chyun IP Office

(57) ABSTRACT

An electromagnetic shielding device (ESD) is disposed on a PCB and includes a cover and a conductive rubber frame. The cover is made of a conductive material. and a through hole. The conductive rubber frame encloses the periphery region of the cover, and the partial conductive rubber frame fills in the through hole to affix the conductive rubber frame onto the cover. The conductive rubber frame contacts the PCB and is electrically connected to a ground end of the PCB. The cover and the conductive rubber frame enclose an electronic component disposed on the PCB.

3 Claims, 3 Drawing Sheets

ELECTROMAGNETIC SHIELDING DEVICE

CROSS-REFERENCE TO RELATED APPLICATION

This application claims the priority benefit of Taiwan application serial no. 95117814, filed May 19, 2006. All disclosure of the Taiwan application is incorporated herein by reference.

BACKGROUND OF THE INVENTION

1. Field of Invention

The present invention relates to an electromagnetic shielding device and a method for fabricating the same, and more particularly to an electromagnetic shielding device using conductive rubber as the frame thereof and a method for fabricating the same.

2. Description of the Related Art

One of common problems with an electronic equipment is electromagnetic interference (EMI). A running circuit usually emits electromagnetic radiation, which affects the transmission signals and electric performances of other electronic components. A mobile phone, for example, has a strict requirement on anti electromagnetic interference (anti-EMI), due to a quite fast transmission speed the mobile phone's signal has. Therefore, in general, a mobile phone is always equipped with an electromagnetic shielding device (ESD) on the printed circuit board (PCB) thereof to prevent the electromagnetic radiation from leakage or to avoid an induced in leakage of external electromagnetic radiations, which causes unwanted interferences.

FIG. 1A is a cubic exploded drawing of a conventional electromagnetic shielding device. FIG. 1B is a cubic drawing of the electromagnetic shielding device in FIG. 1A after assembling. Referring to FIGS. 1A and 1B, a conventional electromagnetic shielding device 100 is made of metal material and includes a metallic frame 110 and a metallic cover 120. The metallic frame 110 is fixed on a PCB 130 by using surface mount technology (SMT) and has multiple protrusion portions 112 on the outer surface 110a thereof. The metallic cover 120 has a cover plate 122 and a side wall 124, which joins the periphery region of the cover plate 122 has multiple through holes 126 corresponding to the above-mentioned protrusion portions 112.

To assemble the metallic cover 120 onto the metallic frame 110, the inner surface of the side wall 124 of the metallic cover 120 is fit on with the outer surface 110a of the metallic frame 110, followed by buckling the protrusion portions 112 on the metallic frame 110 in the corresponding through holes 126 of the metallic cover 120, so as to reliably assemble the metallic cover 120 with the metallic frame 110.

Since the metallic cover 120 and the metallic frame 110 are closely interconnected by means of the above-described approach, the metallic cover 120 is unlikely separated from the metallic frame 110. In turn, the metallic cover 120 is accordingly hard to be disassembled from the metallic frame 110 when the electronic components on the PCB 130 need to be maintained. As a usual maintain manner today, some hand tools, such as tweezers, are used to prize the side wall 124 of the metallic cover 120, followed by removing the metallic cover 120 from the metallic frame 110. However, during removing the metallic cover 120 from the metallic frame 110, the side wall 124 of the metallic cover 120 are likely deformed and then the metallic cover 120 is hard to keep its original shape for using repeatedly. Besides, during disassembling the metallic cover 120, the integrity of the outer surface 110a of the metallic frame 110 is further destroyed. For a metallic frame 110 fixed on the PCB 130 by using surface mount technology (SMT), an accidental operation mistake resulting in integrity loss of the metallic frame 110 may further cause assembly troubles after maintaining.

On the other hand, it needs to take account of material cost issue. For a usual electromagnetic shielding device today, the cover and the frame thereof are made of metal. To get better metal conductive efficiency, copper is a preferred choice for the cover and the frame. However, in recent years, the prices of metal material together with most of crude material, particularly the price of copper, has been soaring continuously, which further increases the production cost of an ESD to impressive extent.

SUMMARY OF THE INVENTION

An objective of the present invention is to provide an ESD, which uses conductive rubber to fabricate the frame thereof, so as to solve the problem of hard disassembly caused by a conventional metallic frame and occurred during maintaining.

Another objective of the present invention is to provide a method for fabricating an ESD to solve the problem of expensive production cost caused by the prior art where metal material is used to fabricate an ESD.

To achieve the above-described or other objectives, an embodiment of the present invention provides an ESD disposed on a PCB. The ESD includes a cover and a conductive rubber frame. The cover is made of a conductive material and has at least a through hole. The conductive rubber frame encloses the periphery region of the cover, and the through holes are filled with some portions of the conductive rubber frame to fix the conductive rubber frame on the cover. The conductive rubber frame contacts the PCB and is electrically connected to the ground end of the PCB. Wherein, the cover forms an enclosed space to contain electronic components, so that the electronic components are enclosed by the cover and the conductive rubber frame to avoid EMI.

In an embodiment of the present invention, the above-described conductive material is metal.

In an embodiment of the present invention, the cover includes a cover plate and a side wall joining the cover plate, and at least a through hole is disposed in the side wall.

In an embodiment of the present invention, the above-described conductive rubber frame includes a sheath portion and at least a plug portion. The sheath portion encloses the side wall; the plug portion is located in the through hole, while both ends of the plug portion join the sheath portion enclosing the side wall.

In an embodiment of the present invention, the above-described conductive rubber frame further includes at least a positioning portion, which extends towards the PCB. The PCB has at least a positioning hole corresponding to the positioning portion, and the positioning portion resides in the positioning hole, so as to position the cover and the conductive rubber frame on the PCB.

To achieve the above-described or other objectives, the present invention further provides a method for fabricating an ESD. Firstly, a cover made of a conductive material and having at least a through hole is provided. Perform a buried injection process, wherein a conductive rubber material is used to enclose the periphery region of the cover to form a conductive rubber frame and to make a part of the conductive rubber frame fill in the through hole.

In an embodiment of the present invention, the above-described conductive material is metal.

In an embodiment of the present invention, the above-described cover includes a cover plate and a side wall joining the cover plate, and at least a through hole is disposed in the side wall.

In an embodiment of the present invention, the above-described conductive rubber frame further includes at least a sheath portion, at least a plug portion and at least a positioning portion. The sheath portion encloses the side wall; the plug portion is located in the through hole, while both ends of the plug portion join the sheath portion; the positioning portion is protruded from the surface of the conductive rubber frame.

The ESD of the present invention mainly includes a cover and a conductive rubber frame enclosing the cover. The conductive rubber frame can be directly fabricated on the cover by using a buried injection process, which effectively reduces the component number of the ESD and simplifies the mounting process flow thereof. Besides, due to the elasticity the conductive rubber material possesses, the problems of disassembly difficulty and low repeatable usage caused by the prior art where the cover and the frame of a conventional ESD are made of metal can be solved. Furthermore, due to the low costs of the conductive rubber material and the die development, an entire ESD is expectedly produced in a cost-effective way.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 1A:
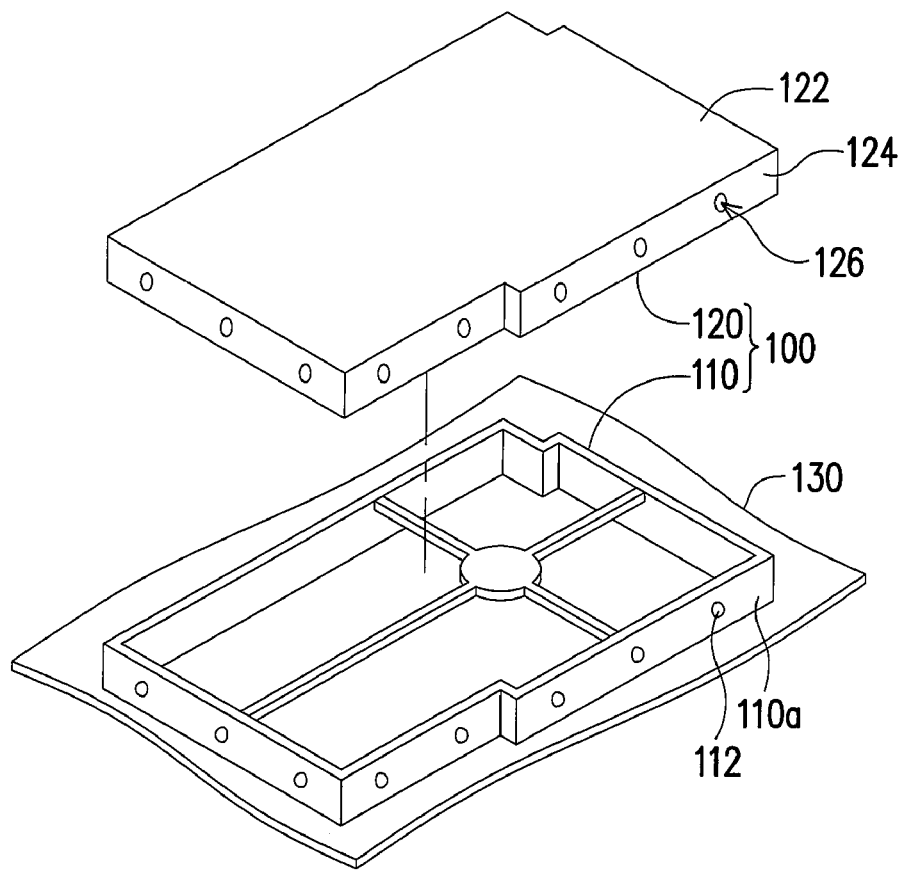
FIG. 1A is a cubic exploded drawing of a conventional electromagnetic shielding device.
Figure 1B:
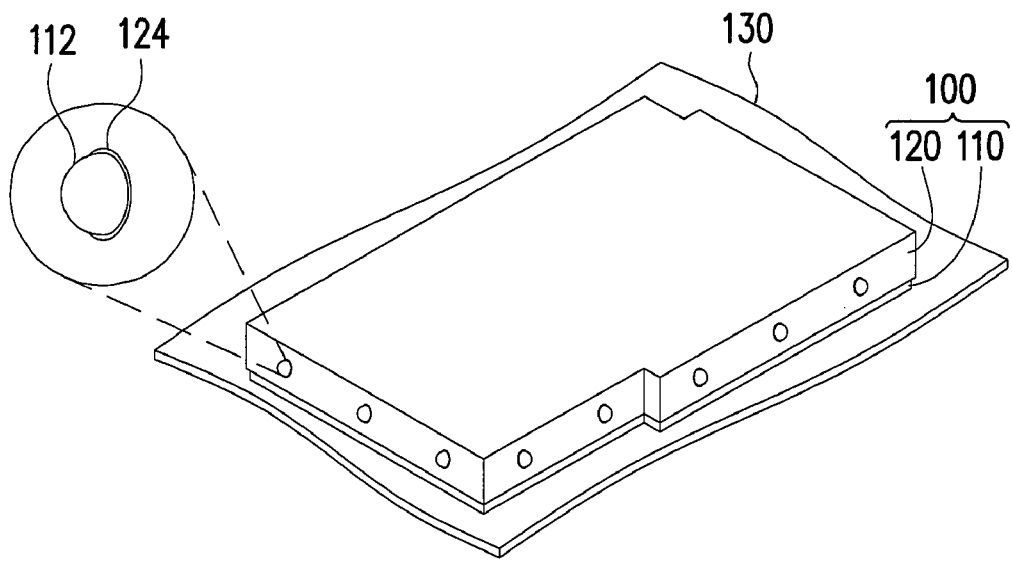
FIG. 1B is a cubic drawing of the electromagnetic shielding device in FIG. 1A after assembling.
Figure 2A:
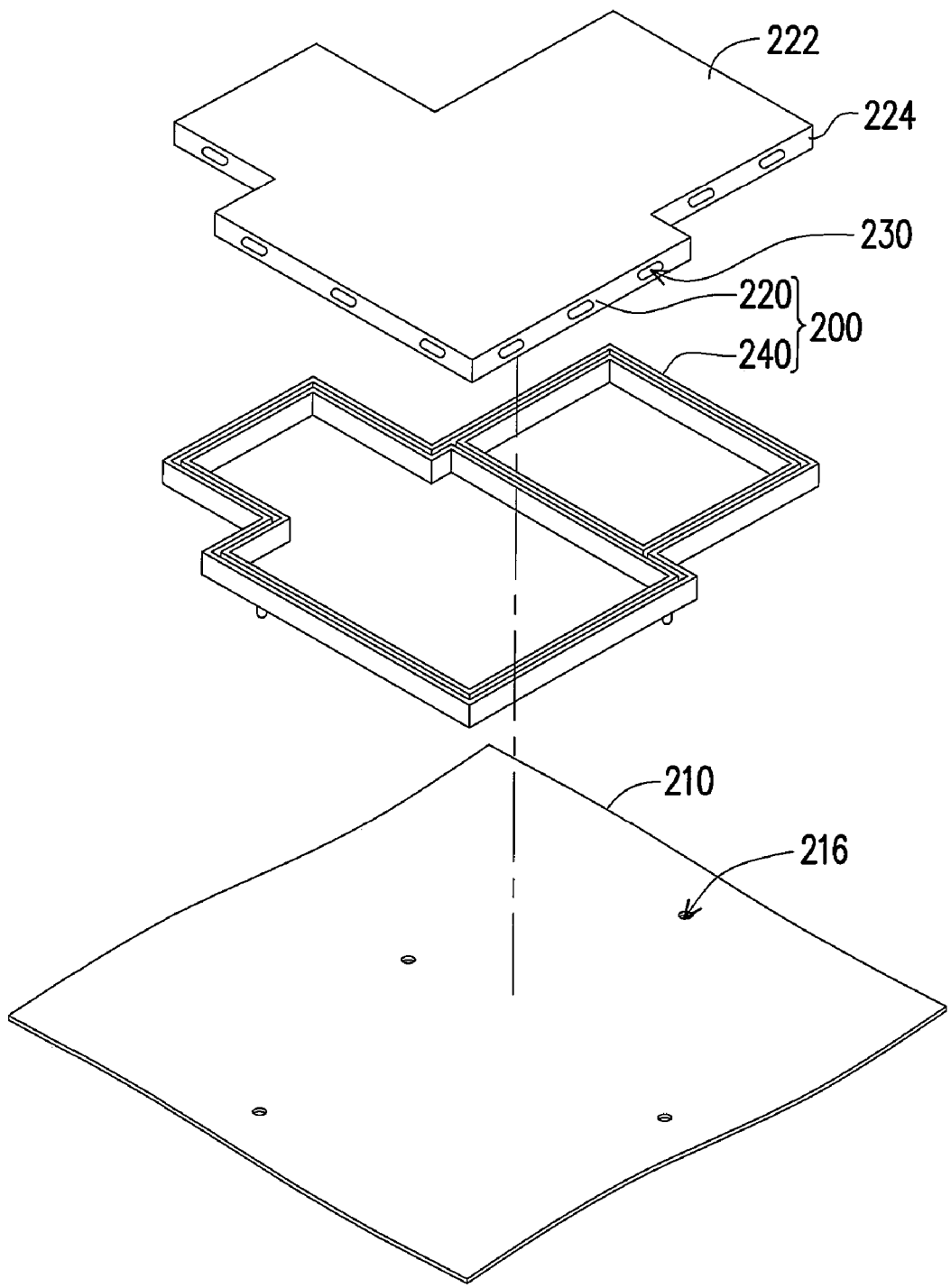
FIG. 2A is a cubic exploded drawing of an electromagnetic shielding device (ESD) according to an embodiment of the present invention.
Figure 2B:
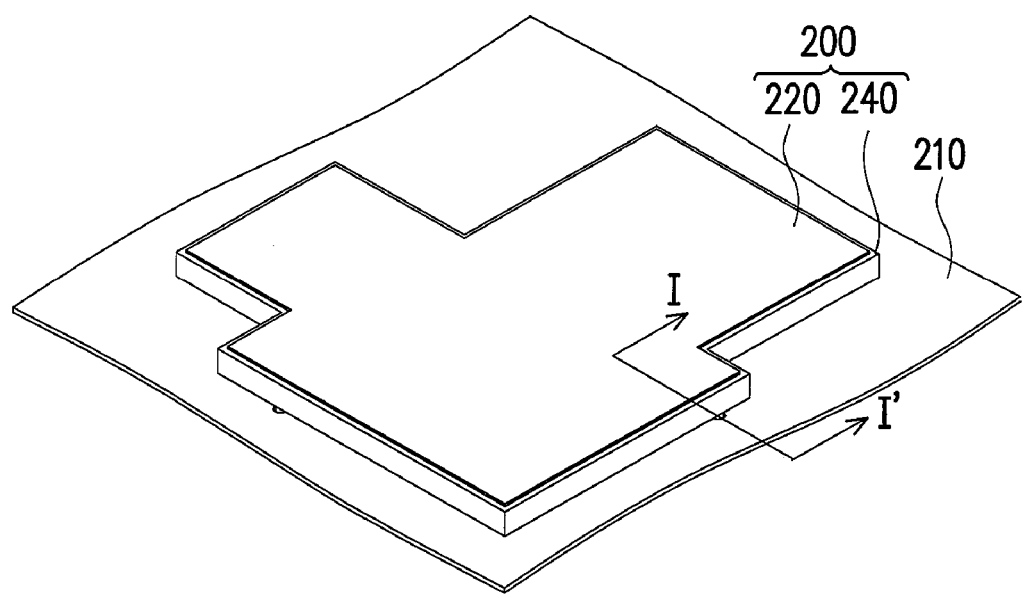
FIG. 2B is a cubic drawing of the ESD in FIG. 2A after assembling.

FIG. 2A is a cubic exploded drawing of an electromagnetic shielding device (ESD) according to an embodiment of the present invention; FIG. 2B is a cubic drawing of the ESD in FIG. 2A after assembling. Referring to FIGS. 2A and 2B, an ESD 200 mainly includes a cover 220 and a conductive rubber frame 240, wherein the cover 220 is made of metal, while the conductive rubber frame 240 is made of conductive rubber. The ESD 200 is disposed on a PCB 210 to enclose the electronic component disposed on the PCB 210 (not shown). By means of the ESD 200, the electronic component on the PCB 210 is isolated from an external electromagnetic interference (EMI), and the leakage of the electromagnetic radiation generated from the electronic component is prevented as well.

Figure 3:
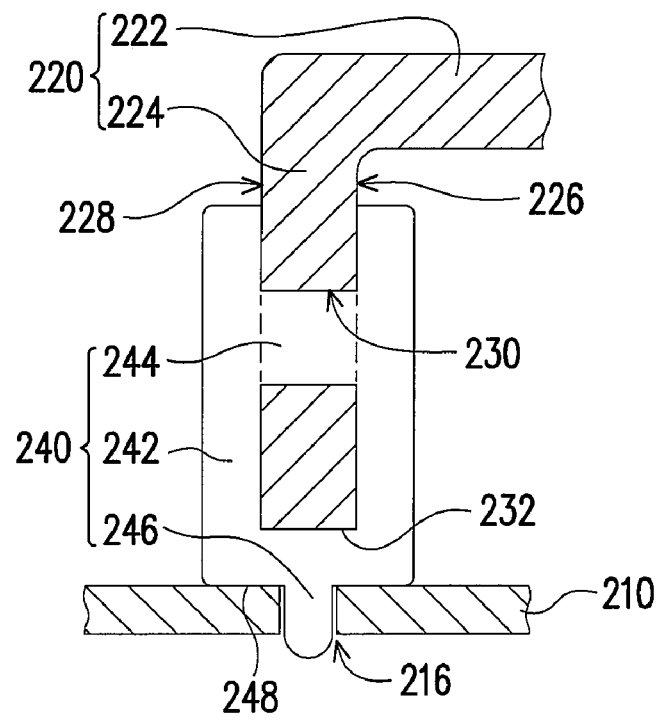
FIG. 3 is a cross-sectional view of the ESD in FIG. 2B across the sectioning plane I-I'.

FIG. 3 is a cross-sectional view of the ESD in FIG. 2B across the sectioning plane I-I'. Referring to FIGS. 2A and 3, the cover 220 includes a cover plate 222 and a side wall 224 joining the periphery region of the cover plate 222, where the side wall 224 extends towards the PCB 210. The side wall 224 has an inner surface 226, an outer surface 228 opposite to the inner surface 226, multiple through holes 230 and a bottom surface 232. The through hole 230 can be long-round hole as shown in FIG. 2A or other shape holes, such as round hole, square hole or rectangular hole.

Referring to FIG. 3, the conductive rubber frame 240 takes a frame shape and closely encloses the inner surface 226, outer surface 228 and bottom surface 232 of the side wall 224. The through hole 230 is filled with a part of the conductive rubber frame 240 to affix the conductive rubber frame 240 on the side wall 224 of the cover 220. As shown in FIG. 3, the conductive rubber frame 240 further includes a sheath portion 242, multiple plug portions 244 and multiple positioning portions 246, wherein the sheath portion 242 has a bottom portion 248. The sheath portion 242 encloses the inner surface 226, the outer surface 228 and the periphery region of the bottom surface 232 of the side wall 224 of the cover 220. The plug portions 244 are disposed corresponding to the through holes 230 of the side wall 224 and placed in the through holes 230, respectively. Both ends of the plug portion 244 respectively join two parts of the sheath portion 242, where the two parts enclose the inner surface 226 and the outer surface 228 of the side wall 224, respectively. In this way, the conductive rubber frame 240 is reliably fixed on the side wall 224 of the cover 220 not to worry about separating from the cover 220. The present invention does not limit the numbers and places of the through holes 230 and the plug portions 244. In addition, the bottom portion 248 of the conductive rubber frame 240 can be optionally served for disposing multiple positioning portions 246 on it for the positioning purpose, wherein the positioning portions 246 extend towards the PCB 210.

After combining the cover 220 with the conductive rubber frame 240 to form the ESD 200, the positioning portions 246 of the conductive rubber frame 240 is inserted into the corresponding positioning holes 216 on the PCB 210. An enclosed space between the ESD 200 and the PCB 210 is formed, as shown in FIG. 2B and the enclosed space encloses the electronic component disposed on the PCB 210. By means of some parts over the ESD 200, the position of the ESD 200 is restricted, and the ESD 200 is accordingly not separated from the PCB 210. Continuing to FIG. 3, since the conductive rubber frame 240 closely encloses the side wall 224 of the cover 220, the conductive rubber frame 240 and the cover 220 are electrically connected to each other. The electromagnetic wave absorbed by the cover 220 of the ESD 200 can be induced to the ground end of the PCB 210 via the conductive rubber frame 240, so that the electronic component disposed on the PCB 210 is protected from EMI.

The method for fabricating the above-described ESD 200 is described as follows. First, a sheet of metal is cut out to have an outline required by the cover 220, followed by punching to complete the through holes 230. Next, the side wall 224 is completed by press forming. After that, a conductive rubber material is used to conduct a buried injection process, where a conductive rubber frame 240 is formed on the side wall 224 of the cover 220. The conductive rubber frame 240 encloses the inner surface 226, the outer surface 228 and the bottom surface 232 of the side wall 224. A part of the conductive rubber frame 240 (i.e. the plug portions 244) fills in the through holes 230, so as to affix the conductive rubber frame 240 on the side wall 224 of the cover 220. Thus, the entire process for fabricating the ESD 200 is finished.

In summary, the conductive rubber frame of the embodiment is directly fabricated on the side wall of the metallic cover by conducting a buried injection process. Therefore, the ESD of the present invention is designed with 'one-body forming'. In comparison with the conventional design where the metallic cover and the metallic frame of an ESD are designed as two independent components, the ESD design of the present invention can effectively reduce the number of the employed components and simplify the mounting process flow thereof.

Furthermore, instead of the prior art where a SMT process is used to affix an ESD onto a PCB, the present invention uses the positioning portions of the ESD to be inserted into the positioning holes on the PCB and restricts the ESD position by means of other components, so as to reliably affix the ESD onto the PCB. Therefore, in comparison with the prior art, the present invention has advantages of, not only a convenience to disassemble the ESD from the PCB 210 during maintaining, but also avoiding the cover or the frame structure from damage, which effectively advances the repeat usage of the ESD 200. Without a hand tool to disassemble the cover also avoids an accidental operation mistake, which eliminates the possibility of the frame damage and easies the assembly and disassembly of the cover and the frame.

In terms of production cost, since the conductive rubber material and the die-making cost are cheaper than the metallic material, the present invention further effectively lowers the fabrication cost of an entire ESD.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. An electromagnetic shielding device (ESD), disposed on a PCB comprising an electronic component disposed thereon and a ground end, the ESD comprising:
   a cover made of a conductive material, the cover having a through hole and a containing space, wherein the cover comprises a cover plate and a side wall joining the cover plate, while the through hole is formed in the side wall; and
   a conductive rubber frame enclosing the periphery region of the cover, a part of the conductive rubber frame filling in the through hole to affix the conductive rubber frame on the cover, wherein the conductive rubber frame contacts with the PCB and is electrically connected to the ground end, and the electronic component is enclosed by the cover and the conductive rubber frame, wherein the conductive rubber frame comprises:
   a sheath portion, enclosing the side wall; and
   at least a plug portion, located in the through hole, wherein both ends of the plug portion join with the sheath portion.

2. The ESD as recited in claim 1, wherein the conductive material is metal.

3. The ESD as recited in claim 1, wherein the conductive rubber frame comprises at least a positioning portion extending towards the PCB, the PCB has a positioning hole corresponding to the positioning portion, the positioning portion is disposed in the positioning hole, so as to position the cover and the conductive rubber frame on the PCB.

* * * * *